United States Patent [19]

Walker et al.

[11] 4,067,764
[45] Jan. 10, 1978

[54] METHOD OF MANUFACTURE OF SOLAR CELL PANEL

[75] Inventors: Jack S. Walker, Sylmar; Wilfred C. Kittler, Pasadena, both of Calif.

[73] Assignee: Sierracin Corporation, Sylmar, Calif.

[21] Appl. No.: 777,762

[22] Filed: Mar. 15, 1977

[51] Int. Cl.² .......................................... H01L 31/04
[52] U.S. Cl. ...................... 156/267; 136/89 H; 156/286; 156/292; 156/300; 156/309; 428/140; 428/195; 428/430; 428/525
[58] Field of Search ............... 136/89 H; 156/99, 104, 156/106, 267, 286, 292, 300, 309; 428/38, 140, 210, 428, 441, 430, 525, 195

[56] References Cited

U.S. PATENT DOCUMENTS

| | | | |
|---|---|---|---|
| 3,072,520 | 1/1963 | Groth | 156/292 |
| 3,255,567 | 7/1966 | Keslar et al. | 156/104 |
| 3,654,012 | 4/1972 | Schlager | 156/286 |
| 3,740,281 | 6/1973 | Fujiwara | 156/106 |
| 3,957,537 | 5/1976 | Baskett et al. | 156/99 |
| 4,009,054 | 2/1977 | Gocherman et al. | 156/99 |

Primary Examiner—William A. Powell
Assistant Examiner—Jerome W. Massie
Attorney, Agent, or Firm—Christie, Parker & Hale

[57] ABSTRACT

There is described a solar cell panel consisting of an outer rigid transparent faceply of glass or plastic material to which are applied at least two layers of plastic such as polyvinyl butyral between which are positioned a plurality of solar cell wafers. A thin flexible film of polyethylene terephthalate forms the other outer surface of the panel. The panel is manufactured by laminating the materials together and allowing the margins of the plastic film to extend beyond the polyvinyl butyral layers so that the film can be brought into direct contact and sealed to a rigid base plate, forming a fully encapsulating structure. The assembled structure is then evacuated to withdraw air and to squeeze the layers together to promote adhesion. The evacuated laminated structure is then placed in an oven for applying heat and pressure to the laminated structure for permanent bonding. After cooling, excess film is trimmed from around the edges of the rigid face plate.

3 Claims, 3 Drawing Figures

METHOD OF MANUFACTURE OF SOLAR CELL PANEL

THE FIELD OF THE INVENTION

This invention relates to the manufacture and construction of solar cell panels.

BACKGROUND

Solar cell panels for converting radiant energy from the sun directly into electrical energy are well known. Heretofore such panels have been constructed by enclosing the solar cell wafers in transparent silicon or other plastic material laminated between two rigid plies of glass or other suitable transparent material. Once encapsulated, the solar cells cannot be repaired or replaced. Furthermore, laminated glass panels are heavy and limited in their ability to absorb shock. Construction of laminated panels using outer layers of rigid material also presents an encapsulation problem since the flat surfaces of the rigid materials do not conform to variations in thickness of the solar cell encapsulation layers.

SUMMARY OF THE INVENTION

The present invention is directed to an improved method of manufacturing a solar cell panel. In brief, the panel is constructed from a single faceply of rigid transparent material such as glass on a suitable hard plastic to which is laminated an intermediate layer of resilient transparent thermoplastic encapsulation material in which are embedded a plurality of thin solar cell wafers. The encapsulation material is overlaid with an outer flexible plastic film. in the manufacturing process, the flexible film has a marginal portion which extends beyond the perimeter of the faceply, the marginal portion being sealed beyond the edges of the glass faceply around the entire periphery of the assembly to a supporting metal plate. A vacuum port is placed in the marginal portion of the film or through the baseplate in this area so that entrapped air may be withdrawn and pressure applied to improve uniform adhesion between the layers. The evacuated assembly is placed in an oven to subject it to the necessary heat and pressure to bond the layers together. After cooling any excess film is trimmed from around the edges of the glass.

DESCRIPTION OF THE DRAWING

For a more complete understanding of the invention, reference should be made to the accompanying drawings, wherein.

DETAILED DESCRIPTION

Figure 1:
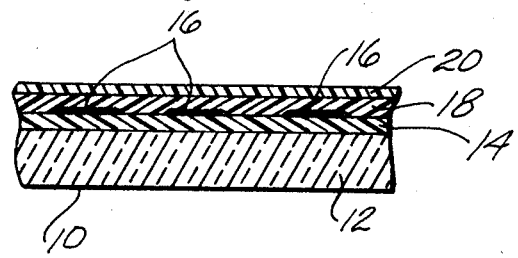
FIG. 1 is a cross-sectional view of a solar cell panel according to the present invention.

Referring to FIG. 1 in detail, the numeral 10 indicates generally a cross section of a small portion of a solar cell panel. The solar cell panel includes a transparent faceply 12 preferably made of glass typically ⅛ inches in thickness and of the desired dimensions. A first layer 14 of plasticized polyvinyl butyral typically 0.030 inches (0.76mm) in thickness is applied to one surface of the glass faceply 12. A plurality of solar cells 16, which are manufactured in a prewired matrix, are positioned on top of the first layer 14. No indication of the electrical interconnection of the solar cells is made in the drawing since it is not material to understanding or use of this invention. Only the external electrical connection 17 is illustrated. The solar cells are generally in the form of circular or square wafers that are extremely thin in cross section, for example, about 0.015 inch thick. A second layer of polyvinyl butyral 18 about 0.030 inch thick overlays the solar cells 16 so that the solar cells are fully encapsulated between and within the polyvinyl butyral material. Finally, an outer protective shield in the form of a thin flexible film of bi-axially stretched polyethylene terephthalate, sold, for example, by DuPont under the trademark "Mylar," is bonded to the polyvinyl butyral to complete the solar cell laminate. Such film is about 0.005 inch thick in one embodiment.

This arrangement, unlike conventional solar cell panel construction in which the solar cells are embedded in a thermoplastic material laminated between two rigid plies of glass, requires only a single rigid ply for providing stiffness and damage-resistance to the face of the panel, while at the same time providing a lighter weight structure which is better able to withstand or absorb shock. The Mylar film provides substantial protection because of its inherent toughness, yet, because of its flexibility, provides better conformance to surface irregularities produced by the encapsulated solar cells. The outer Mylar film also provides the ability to gain access to the encapsulated solar cell units for connecting electric terminals or repair, which was not possible where the cells are encapsulated between two sheets of glass. The panel is made by laminating the layers together and bonding the layers by the application of temperature and pressure. It has been found that the plasticized polyvinyl butyral bonds securely to glass and to the polyethylene terephthalate by the application of heat and pressure alone. The surface of the polyethylene terephthlate film can be treated chemically or by glow discharge to enhance adhesion, as is well known.

In the past, the lamination of glass panels with thermoplastic layers and embedded solar cells has been accomplished by placing the assembly inside a vacuum bag and withdrawing the air from the bag to remove any air bubbles from between the laminations. The vacuum also provided up to one atmosphere of external pressure to the laminate to squeeze the layers together while the assembly was subjected to an elevated temperature, as in an oven or the like.

The present invention provides a unique arrangement for assembling the laminate by utilizing the outer layer of polyethylene terephthalate as a part of a vacuum sealed region. Use of a separate vacuum bag is avoided.

Figure 2:
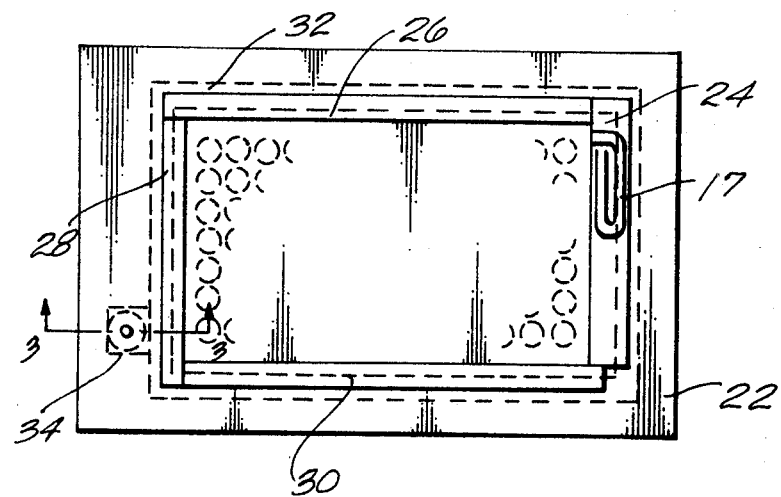
FIG. 2 is a plan view of the panel during assembly.
Figure 3:
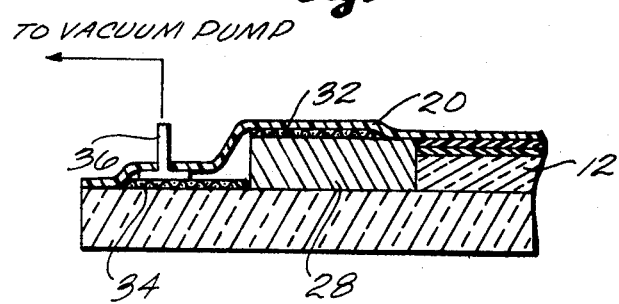
FIG. 3 is an enlarged sectional view taken on the line 3—3 of FIG. 2.

The method of manufacturing the solar panel is shown in FIGS. 2 and 3. Construction is carried out on a flat surface 22 which is preferably a metal plate of larger outer dimensions that the solar cell panels. A layer of cheesecloth or similar type material the size of the panel is laid down on the surface 22 before the glass faceply 12 is placed on the surface. This provides the support for the glass faceply while at the same time compensating for slight irregularities in the surface which could cause the glass to crack when pressure is applied. The first layer of polyvinyl butyral 14 is then applied loosely over the glass layer, followed by the solar cells 16 and second polyvinyl butyral layer 18, all cut to the same outer dimension. The surfaces of the polyvinyl butyral sheets are slightly roughened by embossing or rolling to permit air to be evacuated from the space between the polyvinyl butyral and the glass, for example. A group of four spacers 24, 26, 28 and 30 are then positioned along the four margins of the partially assembled panel. The thickness of the spacers is substantially the same as the thickness of the partially assembled panel. However, the thickness may be varied to control the final edge thickness of the panel. The spacers prevent undue squeezing and thinning of the polyvinyl butyral at the edges of the panel during subsequent processing. Strips of wire mesh, scrim fabric or the like, which are indicated at 32 in FIG. 3 and shown in dotted outline in FIG. 2, are placed around the outside of the panel assembly to overlap the spacers and extend beyond their edges to the flat plate. An additional wire gauze or scrim strip 34 extends beyond the margin of the spacer 28 at one point.

A film of polyethylene terephthalate roughly the size of the metal plate 22 is then laid over the entire assembly, the outer edges of the film being in direct contact with the supporting surface 22. A tack shaped port 36 is arranged with the stem extending through a small hole in the polyethylene terephthalate sheet 20 or baseplate 22 at a position directly over the extra strip 34 of wire mesh. The peripheral interface between sheet 20 and surface 22 is sealed against air leakage, for example, by the use of a suitable putty-like vacuum sealant or mechanical gasket sealing. Two or more solar cell panels can be assembled on a single flat surface, in which case the flexible plastic film is large enough to overlap all of the solar cell panels and extend beyond the edges of the panels. More than one vacuum port can also be used.

Once the assembly is completed, the vacuum port 36 is connected to a vacuum pump to remove as much air as possible from the laminated structure. The wire mesh 32 acts as a bleeder through which the air can move freely from between the laminated layers out through the port 36. After evacuation of the assembly has been accomplished, the entire assembly with the vacuum pump still attached is placed in a pre-heated oven and maintained at an elevated temperature, for example 280° F for an additional 1½ to 2 hours, after which it is removed from the oven and allowed to cool down to room temperature while still maintaining the vacuum. The elevated temperature causes the polyvinyl butyral to soften and adhere to the glass, the solar cells and the thin plastic film, forming a unitary bonded laminate encapsulating the solar cells. After the vacuum is removed, the bonded laminated panel is removed from the plate and the margin of the outer film 35 is trimmed off to the outer dimension of the faceply. Thus the outer film of polyethylene terephthalate in combination with the metal surface 22 functions as an air tight enclosure for the laminated structure during the laminating and bonding process. This avoids any need for separate air bags and assures conformance of the thin plastic film to surface variaions caused by differing thicknesses of material in areas between the solar cells and areas opposite the solar cells.

If a defect occurs in a solar cell or its electrical connection within the completed laminate, the thin film on one face can be cut to obtain access to the location of the defect to make repairs without disturbing other solar cells in the panel. In addition, connections to the solar cell panel may be made by accessing internal leads or connection points allowing terminal location virtually anywhere on the panel. This could not be done with prior solar cell panels wherein the solar cells are between sheets of glass. The flexible film also minimizes stresses on the glass by accommodating thickness variations in the interlayer between the glass and film. Rigid face plies can be unduly stressed if laminated with thick solar cells in the interlayer.

The materials are given by way of example, as are the thicknesses of the materials used. Other hard rigid transparent materials other than glass can be used as the faceply, such as methyl methacrylate, polycarbonate or the like. Other soft, transparent thermoplastic materials such as polyurethanes or silicones could be used in place of polyvinyl butyral. Other tough transparent plastic material, such as copolymers or vinyl chloride or other polyesters could be used in place of the polythylene terephthalate. Materials noted, however, provide an effective bond by adhesion when subjected to heat and pressure without the need for additional adhesive bonding materials. The bonding of polyethylene terephthalate is enhanced by treating the surface first by means of an oxidizing agent, flame treatment or corona discharge techniques. Moisture resistance of the plastic film can be enhanced by vacuum metallizing one face.

What is claimed is:

1. The method of forming a solar cell panel comprising the steps of: laying a rigid transparent faceply on a supporting surface which extends beyond the margins of the faceply on all sides, laying a first layer of soft thermoplastic material on the top of the faceply, placing a network of solar cells on top of the first thermoplastic layer, adding a second thermoplastic layer over the solar cells and first thermoplastic layer, covering the laminated structure with a thin flexible layer of plastic film that is larger in area and extends beyond the margins of the faceply and is in contact with the flat supporting surface, sealing the edges of the film to the supporting surface, applying a vacuum to the space enclosed by the film and supporting surface to remove air and to apply pressure to the assembly and applying heat to the assembly while the vacuum is maintained to form a laminated structure.

2. The method of claim 1 further including the additional steps of: trimming away the excess of film from around the laminated structure after removing the heat and vacuum.

3. The method of claim 1 further including the step of inserting spacers around the margin of the assembly between the film and the supporting surface within the sealed margin of the film prior to vacuum application.

* * * * *